(12) United States Patent
Vitali et al.

(10) Patent No.: US 6,581,816 B2
(45) Date of Patent: Jun. 24, 2003

(54) CAPILLARY FOR BONDING COPPER WIRES BETWEEN A SEMICONDUCTOR CIRCUIT CHIP AND A CORRESPONDING TERMINAL CONNECTOR OF A SEMICONDUCTOR DEVICE

(75) Inventors: Battista Vitali, Romano Di Lombardia (IT); Alessandro Frontero, Bernareggio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/826,429

(22) Filed: Apr. 3, 2001

(65) Prior Publication Data

US 2001/0042781 A1 Nov. 22, 2001

(30) Foreign Application Priority Data

Apr. 11, 2000 (IT) .......................................... MI00A0791

(51) Int. Cl.[7] .............................................. B23K 31/02
(52) U.S. Cl. ............. 228/4.5; 228/180.5; 228/DIG. 904
(58) Field of Search .............................. 228/180.5, 4.5, 228/1.1, 110.1

(56) References Cited

U.S. PATENT DOCUMENTS

| | | | | |
|---|---|---|---|---|
| 5,421,503 A | * | 6/1995 | Perlberg et al. | 228/4.5 |
| 5,485,949 A | * | 1/1996 | Tomura et al. | 228/180.5 |
| 5,662,261 A | * | 9/1997 | Fogal | 228/4.5 |
| 5,884,830 A | * | 3/1999 | Yamazaki et al. | 228/1.1 |
| 5,906,308 A | * | 5/1999 | Yamazaki et al. | 228/4.5 |
| 5,938,105 A | * | 8/1999 | Singh | 228/180.5 |
| 5,984,164 A | * | 11/1999 | Wark | 228/164 |
| 6,171,456 B1 | * | 1/2001 | Hadar et al. | 204/192.15 |
| 6,260,753 B1 | * | 7/2001 | Renard et al. | 228/155 |

FOREIGN PATENT DOCUMENTS

| | | | |
|---|---|---|---|
| JP | 59-191338 A | * | 10/1984 |
| JP | 2-250328 A | * | 10/1990 |
| JP | 402250328 A | * | 10/1990 |
| JP | 4-69943 A | * | 3/1993 |
| JP | 5-275428 A | * | 10/1993 |
| JP | 405275428 A | * | 10/1993 |
| JP | 9-129645 A | * | 5/1997 |
| JP | 409129645 A | * | 5/1997 |

* cited by examiner

*Primary Examiner*—M. Alexandra Elve
*Assistant Examiner*—Kevin McHenry
(74) *Attorney, Agent, or Firm*—Lisa K. Jorgenson; Allen, Dyer, Doppelt, Milbrath & Gilchrist, P.A.

(57) ABSTRACT

A capillary for electrical bonding between a semiconductor chip and corresponding pins of a semiconductor device in which the chip is accommodated includes a body whose terminal portion is substantially frustum-shaped. The body has a diametrical through hole which allows the passage of a copper wire for electrical bonding between the chip and the semiconductor device. The portion of the body that is adjacent a lower end of the through hole is flared, with a flaring diameter and a flaring angle which allows formation of a substantially flat annular peripheral region on a copper ball when the copper ball is placed at a lower end of the copper wire. The copper ball is deformed by the action of the capillary. The formation of the substantially flat annular peripheral region is independent of the position of the copper wire within the through hole of the body of the capillary.

7 Claims, 2 Drawing Sheets

CAPILLARY FOR BONDING COPPER WIRES BETWEEN A SEMICONDUCTOR CIRCUIT CHIP AND A CORRESPONDING TERMINAL CONNECTOR OF A SEMICONDUCTOR DEVICE

FIELD OF THE INVENTION

The present invention relates to a capillary for bonding copper wires between a semiconductor circuit chip and a corresponding terminal connector of a semiconductor device.

BACKGROUND OF THE INVENTION

Electrical bonds are provided between a semiconductor chip and corresponding pins or leads on a metallic leadframe of a semiconductor device. The bonding pins are formed monolithically with the leadframe and allow the semiconductor circuit to be mounted and connected to a preprinted electronic board.

Preset contact pads are arranged on the peripheral region of the semiconductor chip, and are bonded to corresponding pins or leads of the semiconductor device. Fine wires are used for this purpose between the pads and the inward ends of the corresponding pins or leads. The electrical bonds are currently provided using gold and aluminum wires because of their reliability and yield.

However, the possibility of using copper wires instead of gold and aluminum wires has recently been verified. The physical properties of copper make it particularly advantageous with respect to gold and aluminum wires. These properties can be summarized as low electrical resistance, phase stability and reliability when the copper wire is arranged on the silicon pads of the semiconductor chip, low cost and a higher melting current than wires of the same diameter made of different materials.

The use of copper wires is hindered by two main drawbacks. A first drawback is the activation problem related to the formation of loose balls. A ball is a copper sphere that is provided to mutually bond the copper wire and the silicon pad onto which the copper wire is to be bonded. The copper sphere is obtained by melting the copper wire, for example, by applying a suitable voltage between the wire and an electrode with a consequent electrical discharge. In these conditions, the copper is subject to oxidation, and this entails the generation of a loose irregular ball and the deterioration of the soldering process.

A second drawback is that the copper wire is very hard, and this can lead to cracking of the silicon pad of the chip. The first drawback related to the formation of the loose ball or sphere has been solved by using a forming gas. The cracking problem has instead been eliminated by a correct choice of the parameters for bonding the copper wire to the semiconductor chip pad.

However, the presence of an irregularly shaped copper ball is a drawback which the current art has not yet solved. The irregular shape of the copper ball is formed at the end of the copper wire, and therefore allows bonding of the wire to the silicon pad of the semiconductor chip. This irregular shape is mainly due to the geometric shape of the capillary in which the copper wire is passed and which is used to form the copper ball, and most of all, to bond it to the silicon pad of the semiconductor chip.

The optimum configuration to be obtained for the copper ball is one in which the diametrical axis of the ball coincides with the axis of the copper wire bonded thereto. Situations in which the copper ball is substantially tangent to the outer surface of the copper wire to which it is bonded are generally not ideal for bonding, such as ultrasonic bonding of the copper ball to the surface of the semiconductor chip (silicon pad), for example.

FIG. 1 is a sectional view of the end portion of a conventional capillary in which a copper wire is inserted with a copper ball at its lower end. The capillary is designated by the reference numeral 1, the copper wire is designated by the reference numeral 2 and the ball is designated by the reference numeral 3.

In this case, the copper wire 2 is perfectly centered within the hole 4 of the capillary 1, and the result of bonding the ball to the surface of a pad 5 of a semiconductor chip is shown in FIG. 2, which clearly shows that the capillary 1 applies a modeling action to the ball 3, which assumes a shape such as the one shown in detail in FIG. 2a, with a substantially flat annular peripheral region 6.

FIG. 3 instead illustrates a situation in which the capillary 1 is used to solder the copper wire 2 but the wire is not centered within the hole 4 of the capillary 1, and therefore the copper ball 3 is not shaped as in FIG. 2a, i.e., symmetrical. FIG. 3a clearly illustrates how the substantially flat annular peripheral region 6 in this case is not symmetrically formed with respect to a diametrical axis of the copper ball 3. A deformed ball 3, as shown in FIG. 3a, would not be considered acceptable for the purpose of bonding a lead to the silicon pad of a semiconductor chip.

SUMMARY OF THE INVENTION

An object of the present invention is to provide a capillary for the electrical bonding of a copper wire between a semiconductor chip and the corresponding pins of a semiconductor device which accommodates the chip, wherein the deformation of the copper ball is such as to produce an annular peripheral region which is substantially flat and substantially symmetrical with respect to a diametrical axis of the copper ball.

Another object of the present invention is to provide a capillary in which the shape of the end that is adapted to make contact with the copper ball is such as to achieve, on the copper ball, an annular peripheral region that is substantially flat and symmetrical with respect to a diametrical axis of the copper ball.

Yet another object of the present invention is to provide a capillary which offers adequate characteristics of yield in the process for bonding the copper wire to the semiconductor chip.

Another object of the present invention is to provide a capillary which is highly reliable, relatively straightforward to manufacture and at competitive costs.

These and other objects in accordance with the present invention are achieved by a capillary for electrical bonding between a semiconductor chip and corresponding pins of a semiconductor device in which the chip is accommodated using a capillary comprising a body whose terminal portion is substantially frustum shaped and has a diametrical through hole which allows the passage of a copper wire for electrical bonding between the chip and the semiconductor device. The portion of the body that is adjacent to the lower end of the through hole is flared, with a flaring diameter and a flaring angle which allows formation of a substantially flat annular peripheral region on a copper ball when the copper ball placed at the lower end of the copper wire is deformed by the action of the capillary. The formation of the substantially flat annular peripheral region is independent of the position of the copper wire within the through hole of the body of the capillary.

BRIEF DESCRIPTION OF THE DRAWINGS

Further characteristics and advantages of the present invention will become more apparent from the following detailed description of a preferred, but not an exclusive embodiment of the capillary according to the invention, illustrated only by way of a non-limiting example in the accompanying drawings, wherein.

DESCRIPTION OF THE PREFERRED EMBODIMENTS

Figure 1:
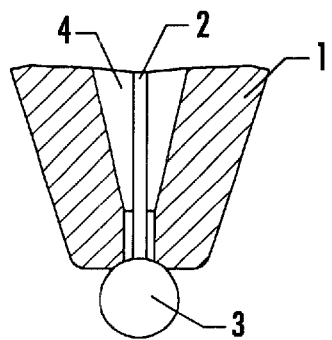
FIG. 1 is a sectional view of a capillary according to the prior art.
Figure 2:
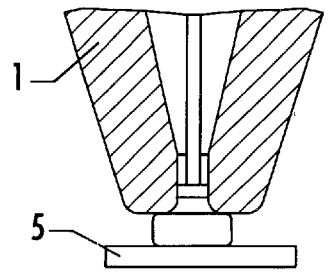
FIG. 2 is a sectional view of the capillary of FIG. 1 with the bonding ball shown in its deformed configuration.
Figure 2A:
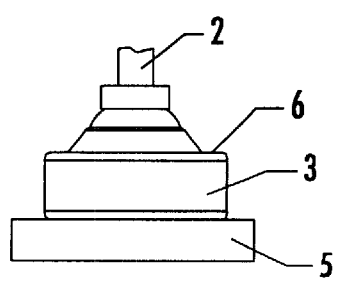
FIG. 2a is a sectional view of the configuration of the ball for mutually bonding the copper wire and the silicon pad as shown in FIG. 2.
Figure 3:
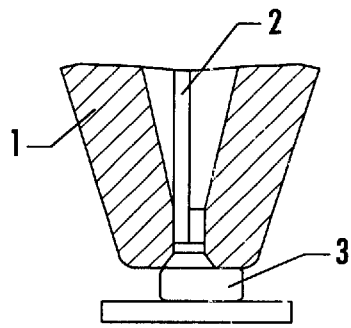
FIG. 3 is a sectional view of the capillary according to the prior art when the copper wire contained therein is not axially centered.
Figure 3A:
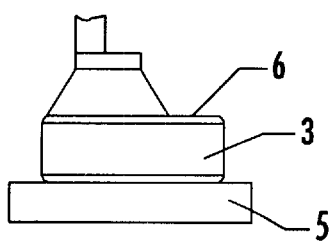
FIG. 3a is a sectional view of the configuration assumed by the deformed copper ball when the copper wire is not perfectly centered within the hole of the capillary as illustrated in FIG. 3.

With reference to the figures, and particularly to FIGS. 4 to 6a, identical reference numerals designate elements which are identical both in FIGS. 4 to 6a and in the preceding figures. The remaining figures, which relate to the prior art, are not discussed further herein, since they have already been described.

The capillary, generally designated by the reference numeral 1, comprises a substantially frustum-shaped body portion which has a diametrical channel 4 for the passage of a copper wire 2 to be bonded to the silicon pad of a semiconductor chip. The copper ball 3 that forms between the pad of the semiconductor chip and the copper wire 2 is to be substantially shaped, once it has been subjected to deformation by the capillary 1, so as to have at least one annular peripheral region 6 which lies substantially symmetrically with respect to a diametrical axis of the copper ball 3.

Figure 4:
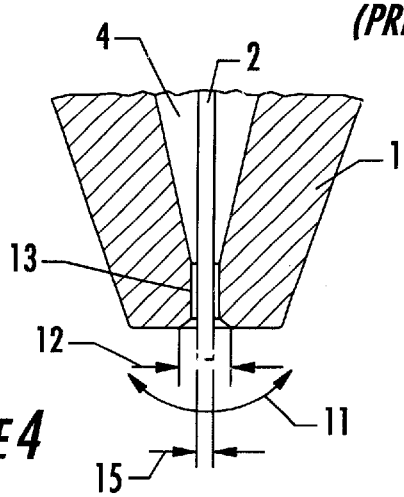
FIG. 4 is a sectional view taken along a transverse plane of the capillary according to the present invention.
Figure 4A:
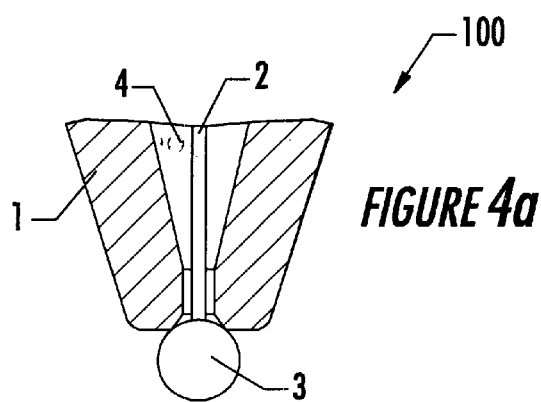
FIG. 4a is a sectional view taken along a transverse plane of the capillary according to the present invention showing the formation of a copper ball.
Figure 5:
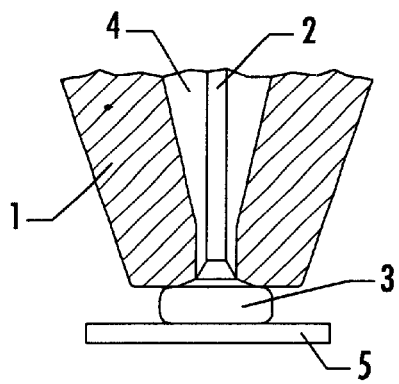
FIG. 5 is a sectional view taken along a transverse plane of the capillary according to the present invention during the deformation of the copper ball, with the copper wire arranged so that it coincides with the diametrical axis of the capillary.
Figure 5A:
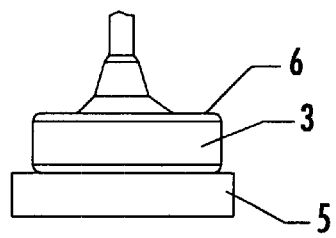
FIG. 5a is a sectional view taken along a transverse plane of the configuration assumed by the copper ball when using the capillary according to the present invention.
Figure 6:
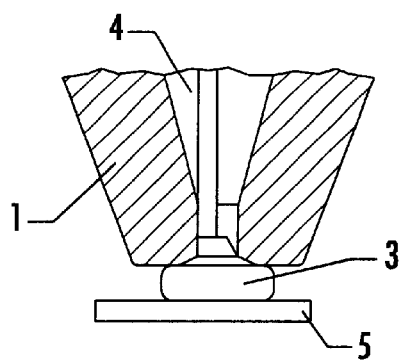
FIG. 6 is a sectional view taken along a transverse plane of the capillary according to the present invention, illustrated in the condition in which the copper wire accommodated within the capillary is not centered in the passage hole.
Figure 6A:
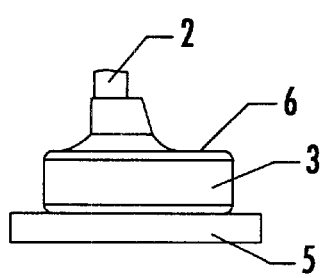
FIG. 6a is a sectional view taken along a transverse plane of the configuration assumed by the deformed copper ball when using a capillary as shown in FIG. 6.

The particular shape of the tip of the frustum-shaped portion of the capillary 1 according to the invention is such as to apply to the ball 3 a compression which is applied substantially symmetrically with respect to a diametrical axis of the ball 3 regardless of whether the copper wire 2 is perfectly centered within the through cavity 4 of the capillary 1 or is arranged as shown in FIG. 4, i.e., substantially adjacent to one of the internal walls of the frustum-shaped body 1.

The particularity of the invention therefore resides in that it determines specific relations between the internal surfaces of the portion of frustum-shaped body of the capillary 1. For this purpose, the lower portion of the frustum-shaped body is shaped so as to have a flared region which blends with the through hole 4 in which the copper wire 2 is accommodated.

The flared region is formed, in terms of flaring angle and diameter, so as to form on the ball 3, when the ball is deformed, an annular peripheral region 6 which is substantially symmetrical around the axis of the ball 3. Therefore, using the reference numeral 11 to designate the flaring angle of the portion of the frustum-shaped body 1, the reference numeral 12 to designate the diameter of the flared region, the reference numeral 13 to designate the diameter of the through hole 4 (the lower portion of the through hole 4) and the reference numeral 15 to designate the diameter of the copper wire, the relation that must be found between these values must be such as to produce, regardless of the position of the copper wire 2 within the passage hole 4, an annular peripheral region 6 which is substantially symmetrical with respect to the diametrical axis of the copper ball 3.

Experimental values, obtained for a copper wire with a diameter of 2 mils (50.8 microns), are given below. For such a copper wire 2, it has been found experimentally that the optimum diameter of the hole 4 is 55±1.5 microns, the flaring angle 11 is 120°±50; and the diameter of the flared region 12 is equal to 82±2 microns.

These values of course are referred to a particular diameter of the copper wire 2, i.e., a diameter of 2 mils. For different diameters of the copper wire 2, the above-cited values will change. However, the basic concept of the invention is to define a flared region of the frustum-shaped portion of the body of the capillary 1. The flared region forms the lower portion of the through hole 4, such as to allow determination of an annular peripheral region 6 which is substantially symmetrical with respect to the diametrical axis of the copper ball 3.

It has been observed that the capillary according to the present invention fully achieves the intended objects, since it allows formation of a substantially flat annular peripheral region on the deformed copper ball, so as to render the bonding between the copper wire and the silicon pad, by means of the ball, acceptable from an electrical viewpoint and in terms of strength of the bond.

The illustrated capillary 1 is susceptible to numerous modifications and variations, all of which are within the scope of the invention. All the details may further be replaced with other technically equivalent elements. The materials employed, so long as they are compatible with the specific use, as well as the dimensions, may be any according to requirements and to the state of the art. The disclosures in Italian Patent Application NO. MI2000A000791, which is assigned to the current assignee of the present invention, and from which this application claims priority are incorporated herein by reference in its entirety.

What is claimed is:

1. A capillary for electrically bonding a semiconductor chip and corresponding pins of a semiconductor device, the capillary comprising:

a body comprising a terminal portion that is substantially frustum-shaped and having a diametrical through hole for allowing passage of a copper wire therethrough for forming a copper ball, a lower end of the through hole having a diameter between a range of about 53.5 and 56.5 microns, said terminal portion comprising a flared portion having a flared diameter and a flared angle adjacent the lower end of the through hole for allowing formation of a substantially flat annular peripheral region on the copper ball when deformed by action of said body, the flared angle being between a range of about 115 and 125 degrees, and with the formation of the substantially flat annular peripheral region being substantially independent of the position of the copper wire within the diametrical through hole of said body.

2. A capillary according to claim 1, wherein a diameter of the copper wire is about 2 mills.

3. A capillary according to claim 1, wherein the flared diameter is between a range of about 80 and 84 microns.

4. A capillary according to claim 3, wherein the flared diameter is about 82 microns.

5. A method for electrically bonding a semiconductor chip and corresponding pins of a semiconductor device, the method comprising:

passing a copper wire through a through hole of a capillary, a lower end of the through hole having a diameter between a range of about 53.5 and 56.5 microns, the capillary comprising a terminal portion that is substantially frustum-shaped, the terminal portion comprising a flared portion having a flared diameter and a flared angle adjacent the lower end of the through hole, the flared angle being between a range of about 115 and 125 degrees;

forming a copper ball using the copper wire adjacent the flared portion of the body; and deforming the copper ball against the semiconductor chip using the flared portion so that a substantially flat annular peripheral region is formed on the copper ball independent of the position of the copper wire within the through hole of the body.

6. A method according to claim 5, wherein a diameter of the copper wire is about 2 mils.

7. A method according to claim 5, wherein the flared diameter is between a range of about 80 and 84 microns.

\* \* \* \* \*

UNITED STATES PATENT AND TRADEMARK OFFICE
CERTIFICATE OF CORRECTION

PATENT NO. : 6,581,816 B2
DATED : June 24, 2003
INVENTOR(S) : Battista Vitali and Alessandro Frontero It is certified that error appears in the above-identified patent and that said Letters Patent is hereby corrected as shown below:

<u>Column 4,</u>
Line 34, delete "$120º \pm 50$" insert -- $120º \pm 5º$ --

Signed and Sealed this

Twenty-third Day of September, 2003

JAMES E. ROGAN
*Director of the United States Patent and Trademark Office*